PLANAR MULTI-CHANNEL FIELD-EFFECT TETRODE

Filed March 23, 1965 3 Sheets-Sheet 1

INVENTOR
RAINER ZULEEG,
BY
W. H. MacAllister, Jr.
ATTORNEY.

PLANAR MULTI-CHANNEL FIELD-EFFECT TETRODE

Filed March 23, 1965

INVENTOR.
RAINER ZULEEG.
BY
W. H. MacAllister, Jr.
ATTORNEY.

INVENTOR.
RAINER ZULEEG,
BY
W. Allister Jr
ATTORNEY.

United States Patent Office 3,354,362

Patented Nov. 21, 1967

3,354,362

PLANAR MULTI-CHANNEL FIELD-EFFECT TETRODE

Rainer Zuleeg, Newport Beach, Calif., assignor to Hughes Aircraft Company, Culver City, Calif., a corporation of Delaware Filed Mar. 23, 1965, Ser. No. 442,079
7 Claims. (Cl. 317—235)

ABSTRACT OF THE DISCLOSURE

A planar field effect tetrode having two grid gates embedded in a semiconductor body with the source electrode disposed over one grid gate and the drain electrode disposed over the other grid gate, and a guard ring surrounding the grid gates to ensure that the current from the source to the drain flows through the grid gates.

This invention relates to novel high frequency solid-state electronic devices and to methods for fabricating such devices. More particularly, the invention relates to field-effect solid-state active devices such as rectifiers and amplifiers. As used herein the term "active device" means any solid-state electronic device which can alter one or more characteristics of an electrical signal, applied thereto, in a controllable and reproducible fashion in contrast to a "passive device" which does not controllably alter the characteristics of an electrical signal applied thereto or transmitted thereby.

Active field-effect semiconductor devices, sometimes called "unipolar" or "analog" transistors, are known and have been described by W. Shockley in an article entitled, "Transistor Electronics: Imperfections, Unipolar and Analog Transistors," published in the November 1952 Proceedings of the I.R.E. (vol. 40, No. 11) at page 1289 and especially at page 1311. Thus, in one form of an analog device, amplification can be provided by forming an electrode, which may be of metal and called the "source" electrode upon a substrate of semi-insulator or semi-conductor material. A "drain" or collector electrode of metal may then be formed on another portion of the semi-conductor body. By masking and vapor-deposition techniques, an additional electrode called the "gate" or control electrode in the form of a grid, for example, may be disposed in the semi-conductor body between the source and drain electrodes. The flow of majority charge carriers from the source to the drain electrodes through the semi-conductor body may be controlled by the field established therein by a signal on the gate electrode. Such devices are closely analogous to vacuum tube devices (hence the term "analog" transistors) except that in these field effect devices the charge carriers flow from cathode (source) to the anode (drain) in a solid medium which is generally a body of semi-insulator or semi-conductor material. In order to provide a convenient distinction between semiconductor transistors utilizing rectifying junctions or point contacts to achieve rectification or amplification, the unipolar transistor devices to which the present invention relates is referred to herein as a field effect tetrode device. In semi-conductor devices of the junction type, for example, charge carriers already available in the semi-conductor body are injected across a junction between regions of opposite conductivity. In contrast, the charge carriers in field effect devices are normally not available in the body of the semi-conductor and are injected thereinto by and from the aforementioned source electrode.

A field effect triode device has been described in my copending application, S.N. 390,379 filed August 18, 1964, which comprises a grid of P-type material, for example, embedded in a body of N-type silicon which grid serves as the "gate" electrode between the "source" and "drain" electrodes, which, in one embodiment may be constituted by highly conductive N-type regions disposed on opposite surfaces of the silicon body. In this device the current flowing from the source electrode to the drain electrode through the body of semi-conductor material is controlled by impressing an appropriate signal on the P-type grid gate. This voltage signal establishes a depletion region around the grid so as to effectively suppress or close off the flow of majority charge carriers through the interstices of the grid from the source to the drain electrodes. It will be appreciated that maximum usefulness and effectiveness of such a device is achieved only by confining the current flowing from the source to the drain to the channel or channels of the grid which are controlled by the electric field established thereon by the grid signal. In integrated circuitry, where such a device may be disposed on a fairly extensive semi-insulator or semi-conductor body, such confinement may be a difficult achievement since the source-drain current may continue to flow around the grid and not through it. Hence in a co-pending application, S.N. 390,292 filed Aug. 18, 1964, by the instant inventor and V. O. Hinkle, Jr., means are provided for confining current flow through the gate electrode which means comprise a "guard" electrode or ring disposed in a body of semi-conductor material so as to laterally surround the grid gate electrode in such a field-effect device. This guard ring may be a region of the semi-conductor body having opposite conductivity type to that of the semi-conductor body itself.

In order to obtain similar advantages characteristic to those of a tetrode vacuum tube device, such as better performance and lower cost (through the avoidance of discrete multiple units or devices), I have discovered that two or more multi-channel field-effect triode devices may be provided in a single structure, analogous to the single structure of a tetrode vacuum tube. Two such field-effect triode devices in a cascade arrangement constitute te solid-state equivalent of a pentode vacuum tube. As an RF amplifier the tetrode structure of the present invention is characterized by a reduction in the gate-to-drain feedback capacitance as well as providing a convenient means for inserting AGC.

It is therefore an object of the invention to provide an improved field-effect device.

Another object of the invention is to provide a field-effect tetrode device.

Yet another object of the invention is to provide an improved field-effect device having more than one gate electrode.

Still another object of the invention is to provide an improved field-effect device having more than one gate electrode and means for confining current flow through the different gate electrodes.

These and other objects and advantages of the invention are achieved by disposing at least two grid gate electrodes in a body of semi-conductor material between the source and drain electrodes and surrounding the gate electrodes from the remainder of the semi-conductor body by a "guard" electrode ring or region so as to confine current flow from the source to the drain electrodes through the gate electrodes. In one embodiment, the source and drain electrodes may be disposed in side-by-side fashion on the same surface of the semi-conductor body, each being positioned over a respective grid electrode. This arrangement permits electrical connections to the electrode portions or regions including the grid gates of the tetrode device to be made on the same surface of the device which simplifies utilization of the tetrode device especially in integrated circuitry applications. By connecting the gate electrode adjacent the drain electrode back to the source electrode, a shield is formed from the output to the input of the device which eliminates any feedback effect as will be more fully explained hereinafter.

In a typical embodiment, a body of N-type semi-conductor material may be utilized with a pair of highly conductive N-type source and drain electrodes disposed on a first surface of the N-type body. A pair of P-type grids of semi-conductor material may be embedded in the semi-conductor body, one underlying the source electrode region and one underlying the drain electrode region. A "guard" ring or region of P-type semi-insulator material is disposed in the N-type body so as to extend from the aforesaid first surface thereof down into the body so as to "wall" in or surround each of the P-type grids. A pair of such P-type guard rings may be provided, each surrounding a respective one of the grids, or a single guard region, having a common leg extending between the grids, in the form of a "figure 8" may be utilized. By such guard ring means, current flowing in the field effect tetrode device will be confined to the channels of the grids thus providing more effective control or "pinch-off" thereof by the grid gates as well as higher transconductance. As suggested previously, the gate electrode adjacent the drain electrode may be connected by a top-surface connection to the source electrode to avoid feedback effects between the output to the input of the device.

The invention will be described in greater detail by reference to the drawings in which.

In connection with the field effect tetrode devices according to the present invention, the term "semi-conductor" refers to and means semi-insulator and other materials such as silicon and germanium which at room temperature have a low intrinsic majority carrier concentration so that at room temperature the material exhibits low electrical conductivity. Other typically suitable materials are compounds of the elements from the Third with elements from the Fifth Columns of the Periodic Table of the Elements such as: aluminum phosphide, aluminum arsenide, aluminum antimonide, gallium phosphide, gallium arsenide, indium phosphide. While any of the aforementioned materials may be used to advantage in the practice of the invention, description herein will be confined primarily to the use of silicon as an exemplary material.

Figure 1:
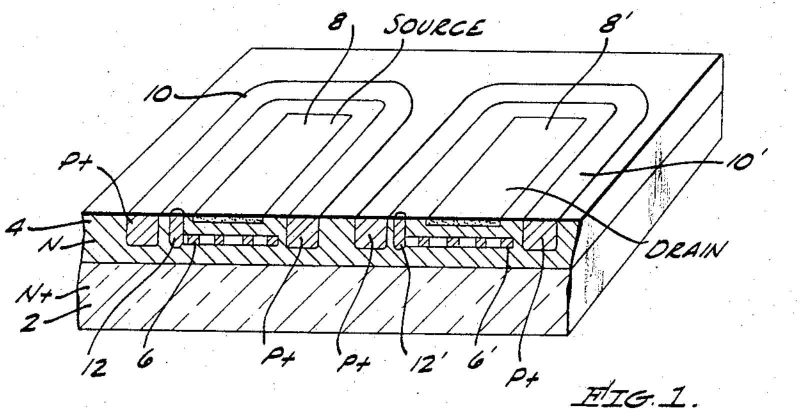
FIGURE 1 is a perspective view partly in section of a field-effect tetrode device according to the invention in one stage of fabrication thereof.

As shown in FIGURE 1, a substrate member 2 of high conductivity N-type silicon, for example, is provided for supporting the field-effect tetrode device to be fabricated. Although such a device may comprise a body of semi-conductor material utilizing metallic layers which may serve as the source and drain electrodes, it is not essential that these electrodes be metallic. As taught in the aforementioned co-pending application of R. Zuleeg (S.N. 333,127, filed Dec. 24, 1963), the source and/or drain electrodes may be formed of highly conductive semi-conductor material.

Because of the great difficulty in vapor-depositing silicon upon substrate surfaces of materials other than silicon itself, the fabrication of a field-effect tetrode device utilizing silicon as the semi-conductor material is facilitated by the employment of a substrate of silicon. Thus, silicon may be conveniently deposited upon silicon, making it feasible to form the operative elements of the triode device upon a substrate of silicon which has been heavily-doped so as to be an effective electrical conductor. It is known that by heavy doping of a semi-conductor body, such body can be converted to degenerative semi-conductor material which means that the body has such a concentration of impurity therein as to cause it to lose its semi-conductor characteristics and to behave as a more conventional electrical conductor. The silicon material constituting the device body proper 4 may then be deposited upon this degeneratively-doped silicon substrate 2.

To achieve the arrangement shown in FIGURE 1 several methods of fabrication are available. A body of semi-conductor material having the resistivity desired for the field-effect device may be initially provided. By diffusion one portion of the body may be doped to degeneracy to thus form the substrate member 2 while leaving the opposite surface portion unchanged in resistivity so as to constitute a device body portion 4 as shown. Alternatively, the substrate member 2 of high conductivity semi-conductor material may be intially provided and, as will be described in greater detail hereinafter, the device body portion 4 may be formed by an epitaxial process on the substrate member 2.

For convenience, and solely for purposes of illustration, the device semi-conductor body 4 in this embodiment of the invention may be referred to as being of N-type conductivity due to an excess of majority charge carriers (i.e., electrons) therein. The grid gate electrode members 6 and 6' may be referred to as being of P-type conductivity due to a deficiency of majority charge carriers (i.e., electrons) therein. It will be understood that such conductivity conditions are usually established by the incorperation of certain impurity elements into the bulk semi-conductor material. Thus silicon, for example, may have any one of such impurity elements as arsenic, antimony, or phosphorous incorporated therein to establish N-type conductivity since these elements contribute an excess of electrons to the silicon for current conduction. P-type silicon may have any one of such impurity elements as aluminum, boron or indium incorporated therein to establish P-type conductivity since these elements lack an excess of electrons for current conduction. The process of incorporating such impurity elements into the crystal lattice structure of semi-conductor materials is well known and is commonly referred to as "doping" and may be achieved by diffusing or alloying the impurity into the semi-conductor body or by including such impurity in the melt from which the semi-conductor crystal body is grown.

According to the invention, the gate electrode members 6 and 6' may be of semi-conductor material and, as has been mentioned previously, of the same material as the semi-conductor body 4 although of different conductivity type. Thus, if as described the semi-conductor body 4 is of N-type conductivity, the gate electrode members 6 and 6' may be of P-type conductivity.

Referring to the drawings, the fabrication of a field-effect tetrode device according to the invention having grid gate electrodes 6 and 6' may be achieved by diffusing an acceptor conductivity-type-determining impurity through a suitable mask upon the surface of the N-type layer 4. The mask may be formed by oxidizing the surface of the silicon body 4 then removing portions of the oxide corresponding to the dimensions and pattern of the grid to be formed. The formation of such an oxide mask may be achieved by photo-resist and etching techniques as is well known in the art. Diffusion of the acceptor impurity is then achieved so as to form a pair of grids 6 and 6' in side-by-side fashion of P-type silicon material in the N-type silicon layer 4. Thereafter the oxide mask is entirely removed. These oxide masking and diffusion techniques are well known in the art and reference is made to U.S. Patent Nos. 2,802,760 to Derick and Frosch and 3,025,589 to Hoerni for a complete, detailed description thereof. The fabrication of suitable grid gate electrode members 6 and 6' is described in detail in my co-pending application, S.N. 390,292, mentioned previously.

A layer of N-type silicon may then be epitaxially deposited upon the P-type grids 6 and 6', as well as on the exposed portions of the N-type layer 4. In this process the silicon may be formed by the epitaxial process and caused to deposit upon the N-type silicon layer 4 and the P-type silicon grid members 6 and 6' by the simultaneous reduction in hydrogen of phosphorous trichloride and silicon tetrachloride at a temperature of from 1200°–1300° C. The epitaxial process is well known and fully described by H. C. Theuerer in the Journal of the Electrochemical Society (1961—vol. 108 at page 649) and by A. Mark in the same Journal (1961—vol. 108 at page 880). This epitaxially deposited layer of N-type silicon forms an integral crystalline extension of the N-type silicon body 4.

Thereafter, the epitaxially deposited upper surface of the N-type body 4 may be masked as by oxidizing this surface and then removing loops or rings of the oxide each having a diameter sufficient to encompass or surround the underlying gate electrode members 6 and 6'.

The assembly is then exposed to an atmosphere containing the vapors of a P-type conductivity-type-determining impurity, such as boron, for example, which impurity, by the process of diffusion into the exposed N-type silicon surface through the annular openings in the oxide mask, converts annular portions 10 and 10' of surface and near-surface portions of the exposed silicon to P-type conductivity thus forming a pair of P-type guard rings 10 and 10' which extend down into the semi-insulator body. Thereafter, the upper surface of the semi-insulator body may be closed or sealed off to the atmosphere by re-oxidizing the exposed portions of the semi-insulator body.

Electrically conductive layers or members 8 and 8', respectively, constituting source and drain electrodes may then be formed by removing portions of the oxide mask to expose areas overlying the grid electrode members 6 and 6' and lying within the P-type guard rings 10 and 10' and then diffusing into these exposed portions of the N-type layer 4' a donor impurity such as arsenic thus forming layers 8 and 8' of high conductivity material therein.

After the source and drain diffusion fabrication step has been completed, portions of the source and drain electrode members 8 and 8' may be oxidized to cover the same and then the oxide film may be removed as by etching the same with hydrofluoric acid so as to expose restricted areas of the source and drain electrode layers 8 and 8' as well as to expose restricted areas over predetermined "wing" portions of the grid electrodes 6 and 6' which underlie, respectively, the source and drain electrode layers 8 and 8'.

Electrical connections to the grid gate electrodes 6 and 6' may be made in one of several manners. Thus, a P-type impurity such as boron, for example, may be diffused into the restricted areas of the semi-conductor body portion 4 which areas overlie the edges or "wings" of the grid electrode members 6 and 6'. It will be understood that this diffusion is made deep enough so as to provide P-type connection regions 12 and 12' which extend down into contact with portions of the grid electrodes 6 and 6', respectively. Alternatively, the P-type connecting regions 12 and 12' may be provided by alloying an acceptor conductivity-type-determining impurity to the semi-conductor body 4 at the aforementioned exposed surfaces thereof.

Figure 2:
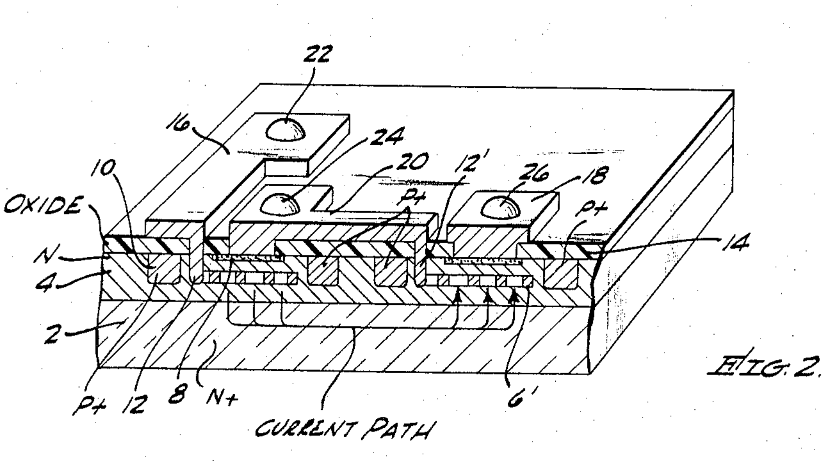
FIGURE 2 is a perspective view partly in section of the field-effect tetrode device shown in FIGURE 1 at a subsequent stage in the fabrication thereof.

Thereafter, except for the exposed surface portions of the gate connection members 12 and 12' and the aforementioned restricted and exposed surface portions of the source and drain electrode layers 8 and 8', it will be understood that the entire upper surface of the N-type semi-conductor body 4 is covered with an oxide coating 14 as best shown in FIGURE 2. Metal contact members are then formed by vapor-depositing metal, for example, gold, through a mask onto pre-selected portions of the oxide layer 14 and the aforedescribed exposed portions of the source and drain electrodes 8 and 8' and the exposed surfaces of the gate connecting members 12 and 12'. Thus the metal layer 16 constitutes the contact through the gate connection member 12 to the grid gate member 6 which underlies the source electrode region 8. In like manner, the metal layer 18 constitutes the contact to the drain electrode region 8'. The metal layer 20 constitutes the contact to the source electrode region 8 and, for purposes which will be more fully explained hereinafter, the metal layer 20 also makes contact, through the gate connection member 12', to the grid gate member 6' which underlies the drain electrode region 8'. For device orientation and/or facility in making circuit connections, metallic "bump" members 22, 24 and 26 are disposed on the metal contact layers 16, 20 and 18, respectively.

The complete device is shown in FIGURE 2 and includes a source electrode member 8 comprising a layer of high conductivity N-type silicon, a drain electrode member 8' comprising also a layer of high conductivity N-type silicon, and a semi-conductor body 4 of lower conductivity N-type silicon in which is embedded a fair of P-type grid gate electrode members 6 and 6' each surrounded, respectively, by a pair of high conductivity P-type channel-confining walls or rings 10 and 10'. In this device the current flowing from the source electrode region 8 to the drain electrode layer 8' through the N-type silicon material 4 may be controlled by impressing a negative voltage signal, for example, on the P-type grid 6. This current path is indicated in heavy black lines in the drawings. An appropriate voltage signal on the grid 6 will establish a space-charge region around the N-type openings or channel portions of the grid member 6, the width of which space-charge region or regions is variable and controllable in accordance with the grid signal. Hence, the channels for the flow of majority charge carrier current through the grid are of variable and controllable cross-sectional area thus permitting one to effectively regulate and suppress or "pinch off" the flow of such current as desired. The P-type wall or guard ring 10 confines the source drain current to the portions of the semi-conductor body 4 between the source and drain electrodes 8 and 8' thus subjecting substantially all of this source drain flow to effective control by grid gate member 6.

It will be understood that the device of FIGURE 2 may also be provided in the reverse polarity; that is, the grids 6 and 6' may be composed of N-type material and the semi-conductor body 4 of P-type material in which case the source and drain electrodes 8 and 8' would be composed of high conductivity P-type material, while the guard rings 10 and 10' would be of high conductivity N-type material.

While the electrically conductive electrode regions constituting the source and drain electrodes 8 and 8' have been described as being formed by diffusion, this is not the only way in which these electrodes may be fabricated. Alternatively, it is possible to deposit a predetermined quantity of gold and antimony (say, 1% antimony) on the surface of the semi-insulator body and to heat the assembly for a short time (say, one or two minutes) at a temperature of from 370°–500° C. so as to alloy the gold-antimony to the silicon material thus forming high conductivity source and drain electrodes 8 and 8'. In some instances this alloying technique may be preferred over diffusion because of the relatively short time required to form such alloy regions in contrast to diffusion processes which often are long enough and of high enough temperatures to cause other regions of the device to undergo undesired further diffusion. To prevent excessively deep alloying, a layer structure of gold-silver-gold may be utilized.

It will thus be appreciated that the tetrode device shown in FIGURE 2 is in principle a series combination of two single multi-channel field effect transistors or triode devices. One of the outstanding electrical characteristics of the device shown in FIGURE 2 is the marked improvement with respect to reducing the so-called Miller effect, i.e., feedback from the output to the input of the device. In a single multi-channel field effect transistor or triode device, the capacitance between the gate and drain ($C_{GD}$) causes this effect and when the device has an amplification factor A, the Miller feedback capacitance is amplified $(1+A)$ times. Hence, in the case of a single field-effect triode device the total input capacitance ($C_{in}$) is $$C_{in}=C_{gs}+C_{GD}(1+A)$$

where $C_{gs}$ is the capacitance between the gate and the source.

Figure 6:
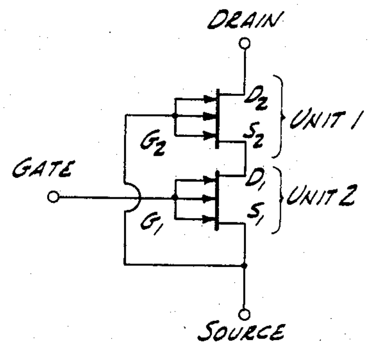
FIGURE 6 is a symbolic representation of the tetrode amplifier device shown in FIGURE 2.
Figure 7:
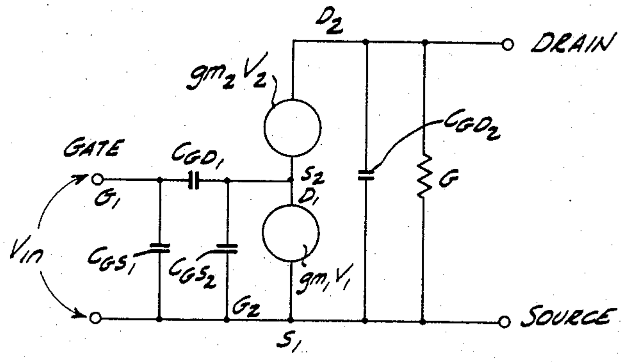
FIGURE 7 is a schematic drawing of the equivalent circuit of the tetrode device shown in FIGURE 2.

It will thus be appreciated that in circuit applications the Miller effect constitutes a capacitance loading of the input in a field-effect triode device which is very undesirable. In the tetrode device of the present invention, this effect is considerably reduced since one of the gates (6', for example) is returned to the source connection (8, for example) thus forming a shield from the output to the input and eliminating any feedback effect. A symbolic representation of the tetrode device of FIGURE 2 is shown in FIGURE 6, and in FIGURE 7 the equivalent circuit of the device is shown, which indicate that there is no longer a capacitance between the gate and drain terminals. Thus, the input capacitance of the tetrode device of the present invention is $$C_{in}=C_{GS_1}+\frac{C_{GD_1}C_{GS_2}}{C_{GD_1}+C_{GD_2}}$$

where $C_{GS_1}$ is the capacitance between the source and the first gate (6), $C_{GD_1}$ is the capacitance between the drain and the first gate (6), and $C_{GS_2}$ is the capacitance between the source and the second gate (6'). Thus where $C_{GS_2}$ is smaller than $C_{GD_1}$, the input capacitance of the tetrode device of the invention reduces to $C_{gs_1}$ which is the capacitance between the source and the first gate (6).

The tetrode device of the present invention can be employed in functional linear electronic circuits by using the two gates (6 and 6') as separate inputs thus performing mixing or converting functions. This is an especially advantageous feature of the device of the invention since a square law characteristic is obtained in such an application.

Figure 8:
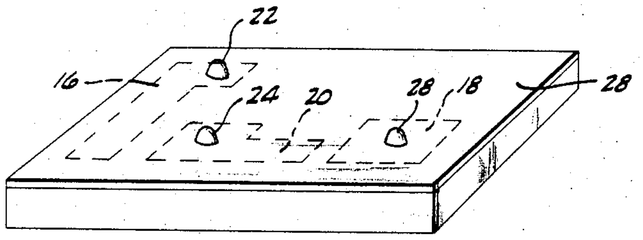
FIGURE 8 is a perspective view of a completely fabricated and encapsulated tetrode device according to the invention.

In FIGURE 8 a completely fabricated and encapsulated tetrode device according to the invention is shown which is especially useful for connection into thin film circuitry. After the metallic connection contact bumps 22, 24 and 26 have been applied to their respective electrode contacts, glass is applied over the entire upper surface of the body and fused thereto with the contact bumps 22, 24 and 26 protruding therethrough whereby electrical connections may be made to the electrode portions of the device.

Figure 3:
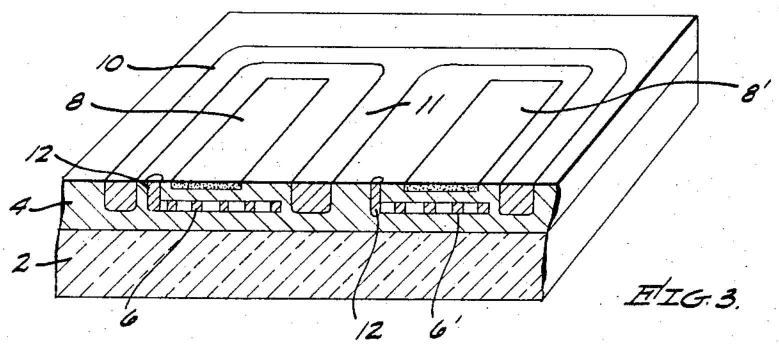
FIGURE 3 is a perspective view partly in section of another embodiment of the field-effect tetrode device of the invention at one stage in the fabrication thereof.
Figure 4:
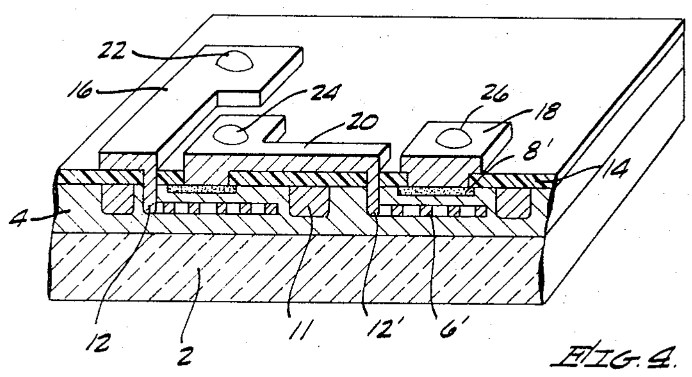
FIGURE 4 is a perspective view partly in section of the field-effect tetrode device shown in FIGURE 3 at a subsequent stage in the fabrication thereof.

FIGURES 3 and 4 show another embodiment of the tetrode device of the invention wherein a common guard ring 10 is provided instead of a pair of separate guard rings 10 and 10' as in the tetrode device of FIGURES 1 and 2. Fabrication of this device is identical to that described in connection with the device of FIGURES 1 and 2 except that the guard ring 10 is in the form of a "figure-eight" so that the source and drain electrodes 8 and 8' are stilll surrounded by the high conductivity guard ring 10 but only one leg (11) of the guard ring is utilized to separate these electrodes. It will be noted in FIGURES 1 and 2 that the source and drain electrodes are actually laterally separated by two guard ring legs which in the device of FIGURES 3 and 4 are replaced with a common cross-leg 11, thus resulting in the "figure-eight" configuration.

Figure 5:
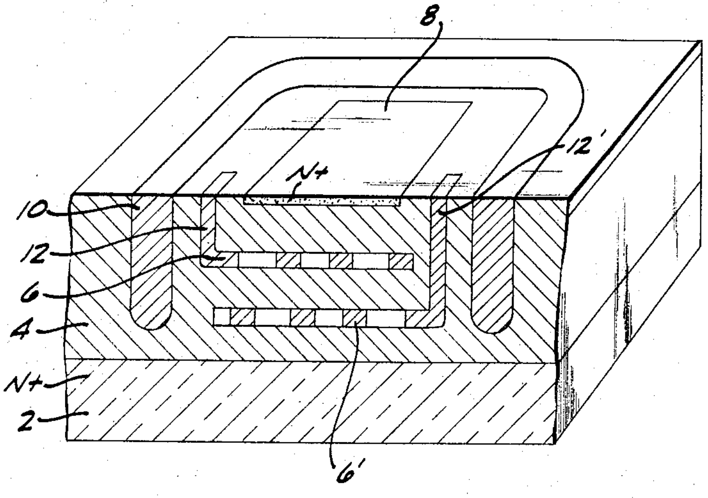
FIGURE 5 is a perspective view partly in section of a field-effect tetrode device according to another embodiment of the invention.

While the tetrode device according to the invention has so far been described as one in which the source and drain electrode regions 8 and 8' are disposed on a common surface of the semi-conductor body 4, the practice of the invention is not limited to this arrangement. Thus, as shown in FIGURE 5, the source electrode 8 may be located on one surface of the semi-conductor body 4 with the high conductivity substrate portion 2 being utilized as the drain electrode. In this embodiment, the grid gates 6 and 6' are disposed one over the other as shown so as to intercept the current path of charge carriers between the source and drain electrodes. It will be understood that this arrangement is arrived at by preparing the semi-conductor region 4 by two separate epitaxial deposition steps. Thus, after the grid 6' is formed, N-type silicon is epitaxially deposited thereover to a predetermined thickness as described in connection with FIGURES 1 and 2. The grid 6 is then formed on the exposed surface of this epitaxially formed layer by diffusion through an oxide mask as described in connection with the formation of the first grid 6'. The oxide mask is then removed and a second epitaxial layer of N-type semi-conductor material is formed over the second grid 6. The fabrication of the source electrode 8 and the guard ring 10 may be the same as previously taught herein. The connections 12 and 12' to the grid electrode 6 and 6', respectively, may be produced by diffusion as taught previously herein, although sequential formation thereof in two stages which may overlap may be necessary. Thus, a portion of the semi-conductor body 4 may be opened through an oxide layer provided on the surface of the second epitaxially formed semi-conductor layer and a diffusion step carried out to form the grid connection 12' to the deepest lying grid 6'. Thereafter, this exposed surface portion may be closed by oxidation and a second surface portion opened to permit formation of the grid connection 12 by diffusion. Since diffusion requires the heating of the entire assembly and since diffusion is a temperature-dependent phenomenon, an undesired further diffusion or penetration of the first-formed connection 12' may occur. It may therefore be desirable to time the formation diffusion of the contacts 12 and 12' so that these connections are achieved without excessive penetration into the semi-conductor body of the contact regions. Thus, the contact region 12' may be formed by a diffusion process which carries the diffusion to a predetermined depth—i.e., half-way into the semi-conductor body portion 4. The surface of the semi-conductor body 4 may then be opened to permit the concurrent diffusion of the grid contact so that it will penetrate to and reach the grid 6 at about the same time it takes to complete the diffusion and penetration of the contact region 12' to the underlying grid 6'.

There thus has been described a novel field-effect tetrode device as well as the fabrication and application thereof.

What is claimed is:

1. A field-effect tetrode device comprising:

(a) a body of semi-conductor material of a first type of conductivity;

(b) a pair of grid control electrode members of semi-conductor material and of opposite conductivity type with respect to said first type disposed within and surrounded by said body of semi-conductor material in side-by-side fashion each of said grid control electrode members having a plurality of current conducting channels extending therethrough;

(c) a pair of electrically conductive electrode members disposed on a common surface of said body of semi-conductor material each overlying a respective one of said grid electrode members;

(d) a region of said body of semi-conductor material of a conductivity type opposite to said first type disposed on said common surface of said body and extending down thereinto so as to surround each of said grid control electrode members;

(e) and means in said semi-conductor body making separate electrical connections to said grid control electrode members.

2. A field-effect tetrode device comprising:

(a) a body of semi-conductor material of a first type of conductivity;

(b) a pair of grid control electrode members of semi-conductor material and of opposite conductivity type with respect to said first type disposed within and surrounded by said body of semi-conductor material in side-by-side fashion each of said grid control electrode members having a plurality of current conducting channels extending therethrough;

(c) a pair of electrically conductive electrode members disposed on a common surface of said body of semi-conductor material each overlying a respective one of said grid electrode members;

(d) a region of said semi-conductor body of a conductivity type opposite to said first type disposed on said common surface of said body and extending down thereinto so as to surround each of said grid control electrode members;

(e) an electrical connection member disposed within said semi-conductor body from one of said grid control electrode members to one of said electrically conductive electrode members;

(f) and means in said semi-conductor body making a separate electrical connection to the other of said grid control electrode members.

3. A field-effect tetrode device comprising:

(a) a body of semi-conductor material of a first conductivity type;

(b) a pair of control electrode members in the form of grids of semi-conductor material of a second conductivity type different from said first type disposed within and surrounded by said body of semi-conductor material in side-by-side fashion;

(c) input and output electrode members comprising degeneratively-doped, electrically conductive discrete surface portions of said semi-conductor body, each overlying a respective one of said control electrode members;

(d) a region of said semi-conductor body of said second type of conductivity disposed on said surface of said body of semi-conductor material and extending down thereinto so as to surround each of said control electrode members;

(e) and means in said semi-conductor body making separate electrical connections to said grid control electrode members.

4. A field-effect tetrode device comprising:

(a) a body of N-type semi-conductor material;

(b) first and second electrically conductive members disposed on a common surface of said semi-conductor body in side-by-side fashion;

(c) first and second control electrode members in the form of grids of P-type semi-conductor material disposed within and surrounded by said body of N-type semi-conductor material and underlying respectively said first and second electrically conductive members;

(d) and a region of P-type semi-conductor material disposed on a surface of said N-type semi-conductor body and extending down thereinto so as to surround each of said first and second control electrode members;

(e) and means in said semi-conductor body making separate electrical connections to said grid control electrode members.

5. The invention according to claim 4 wherein one of said control electrode members is connected to one of said electrically conductive members.

6. A field-effect tetrode device comprising:

(a) a body of semi-conductor material having a first type of conductivity and of predetermined resistivity;

(b) a first layer of semi-conductor material disposed on a first surface of and integral with said body of semi-conductor material, said first layer being of said first type of conductivity and of lower resistivity than said predetermined resistivity;

(c) a second layer of semi-conductor material disposed on another portion of said first surface of and integral with said body of semi-conductor material, said second layer being of said first type of conductivity and of lower resistivity than said predetermined resistivity;

(d) a first internal region of said semi-conductor body underlying said first layer and being in the form of a grid of semi-conductor material of a second type of conductivity opposite to said first type;

(e) a second internal region of said semi-conductor body underlying said second layer and being in the form of a grid of semi-conductor material of said second type of conductivity;

(f) and a region of said semi-conductor body disposed on said first surface thereof having said second type of conductivity and extending down into said semi-conductor body so as to surround said first and second internal regions thereof.

7. A field-effect tetrode device comprising:

(a) a body of N-type semi-conductor material having a predetermined resistivity;

(b) a first region of said N-type semi-conductor body disposed on a first surface thereof and integral therewith being of N-type conductivity but of lower resistivity than said predetermined resistivity;

(c) a second region of said N-type semi-conductor body disposed on another portion of said first surface thereof and integral therewith being of N-type conductivity but of lower resistivity than said predetermined resistivity;

(d) a first internal region of said semi-conductor body underlying said first region thereof and being in the form of a grid of P-type semi-conductor material;

(e) a second internal region of said semi-conductor body underlying said second region thereof and being in the form of a grid of P-type semi-insulator material;

(f) a region of P-type semi-conductor material disposed on said first surface of said semi-conductor body and extending down thereinto so as to surround said first and second internal regions thereof;

(g) and electrical connections to said first and second internal P-type regions and to said first and second N-type regions.

References Cited

UNITED STATES PATENTS

| | | | |
|---|---|---|---|
| 3,025,438 | 3/1962 | Wegener | 317—235 |
| 3,035,186 | 5/1962 | Doucette | 317—235/21 |
| 3,176,192 | 3/1965 | Sueur et al. | 317—235/21 |
| 3,252,003 | 5/1966 | Schmidt | 317—235 X |
| 3,268,374 | 8/1966 | Anderson | 317—235 X |
| 3,271,201 | 9/1966 | Pomerantz | 317—235 X |
| 3,274,461 | 9/1966 | Teszner | 317—235 |
| 3,278,853 | 10/1966 | Lin | 317—235 |

FOREIGN PATENTS

| | | |
|---|---|---|
| 1,037,293 | 4/1953 | France. |
| 912,114 | 12/1966 | Great Britain. |

JOHN W. HUCKERT, *Primary Examiner.*

R. F. POLISSACK, *Assistant Examiner.*